(12) United States Patent
Yang et al.

(10) Patent No.: US 12,271,653 B2
(45) Date of Patent: Apr. 8, 2025

(54) AUDIO PROCESSING APPARATUS AND AUDIO PROCESSING METHOD FOR DYNAMICALLY ADJUSTING AUDIO CLOCK

(71) Applicant: REALTEK SEMICONDUCTOR CORP., Hsinchu (TW)

(72) Inventors: Zhen-Peng Yang, Jiangsu Province (CN); Dong-Yu He, Jiangsu Province (CN); Jian Sun, Jiangsu Province (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 224 days.

(21) Appl. No.: 18/079,112

(22) Filed: Dec. 12, 2022

(65) Prior Publication Data

US 2023/0236790 A1 Jul. 27, 2023

(30) Foreign Application Priority Data

Jan. 26, 2022 (CN) .......................... 202210095189.1

(51) Int. Cl.
*G06F 3/16* (2006.01)
*H03L 7/08* (2006.01)

(52) U.S. Cl.
CPC ................ *G06F 3/162* (2013.01); *H03L 7/08* (2013.01)

(58) Field of Classification Search
CPC .................................. G06F 3/162; H03L 7/08
See application file for complete search history.

(56) References Cited

U.S. PATENT DOCUMENTS

| 7,639,706 | B2 * | 12/2009 | Hamada | H04L 65/764 370/428 |
| 11,109,209 | B2 * | 8/2021 | Cai | H04N 21/43637 |
| 2002/0052967 | A1 * | 5/2002 | Goldhor | G10L 21/04 704/E21.017 |
| 2006/0009983 | A1 * | 1/2006 | Magliaro | G10L 19/24 704/E19.044 |
| 2021/0224028 | A1 * | 7/2021 | Kim | G06F 3/162 |

FOREIGN PATENT DOCUMENTS

TW             202113808 A  *  4/2021

* cited by examiner

*Primary Examiner* — Joseph Saunders, Jr.
(74) *Attorney, Agent, or Firm* — Li & Cai Intellectual Property (USA) Office

(57) ABSTRACT

An audio processing apparatus and an audio processing method for dynamically adjusting an audio clock are provided. The audio processing apparatus includes a first interface, a buffer, a clock generator, a processor, and a second interface. The first interface receives audio data from the host. The buffer stores the audio data to generate a first audio packet and determines relationships between a data volume of the first audio packet and a first upper threshold and a first lower threshold. The second interface outputs the first audio packet and a clock signal to a codec apparatus. In response to the data volume of the first audio packet being less than the first lower threshold, the buffer outputs an underflow interrupt signal. In response to the data volume of the first audio packet being greater than the first upper threshold, the buffer outputs an overflow interrupt signal.

18 Claims, 5 Drawing Sheets

AUDIO PROCESSING APPARATUS AND AUDIO PROCESSING METHOD FOR DYNAMICALLY ADJUSTING AUDIO CLOCK

CROSS-REFERENCE TO RELATED PATENT APPLICATION

This application claims the benefit of priority to China Patent Application No. 202210095189.1, filed on Jan. 26, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an audio processing apparatus and an audio processing method, and more particularly to an audio processing apparatus and an audio processing method that can dynamically adjust an audio clock.

BACKGROUND OF THE DISCLOSURE

In existing audio applications, a universal series bus (USB) is often used for audio playback. However, when using an output function of an audio device class of a USB audio apparatus, during an audio data transmission from a host to the audio apparatus, in response to a data volume of audio data and a bit clock (BCLK) signal of an Inter-IC Sound (I2S) interface not matching, an overflow or an underflow of the I2S interface may occur, resulting in a loss of the audio data and playback failure.

In detail, assuming that the BCLK signal is fixed, in response to the audio data sent by the host being delayed and lasting for a period of time, an empty interruption may occur in the audio apparatus; in response to the audio data sent by the host being early and lasting for a period of time, an overflow interrupt may occur in the audio apparatus.

Therefore, an urgent need exists for a processing mechanism capable of dynamically adjusting the audio clock according to the data volume of the audio data.

SUMMARY OF THE DISCLOSURE

In response to the above-referenced technical inadequacies, the present disclosure provides an audio processing apparatus and an audio processing method that can dynamically adjust an audio clock.

In one aspect, the present disclosure provides an audio processing apparatus for dynamically adjusting the audio clock, and the audio processing apparatus includes a first interface, a buffer, a clock generator, a processor and a second interface. The first interface is configured to receive audio data from a host. The buffer is coupled to the first interface, and the buffer is configured to store the audio data in a first sampling stage to generate a first audio packet. The buffer is configured to determine relationships between a data volume of the first audio packet and a first upper threshold and a first lower threshold. The clock generator is configured to generate a clock signal. The processor is configured to control the clock generator to adjust a frequency of the clock signal. The second interface is coupled to the buffer, and the second interface is configured to output the first audio packet from the buffer and the clock signal from the clock generator to a codec apparatus, such that the encoding and decoding device reads and processes the first audio packet according to the clock signal. In response to the buffer determining that the data volume of the first audio packet is less than the first lower threshold, the buffer is configured to output an underflow interrupt signal to the processor, and the processor is configured to control the clock generator according to the underflow interrupt signal, so as to reduce the frequency of the clock signal. In response to the buffer determining that the data volume of the first audio packet is greater than the first upper threshold, the buffer is configured to output an overflow interrupt signal to the processor, and the processor is configured to control the clock generator according to the overflow interrupt signal, so as to increase the frequency of the clock signal.

In another aspect, the present disclosure provides an audio processing method for dynamically adjusting audio clock, and the audio processing method includes: configuring a first interface to receive audio data from a host; configuring a buffer to store the audio data in a first sampling stage to generate a first audio packet, and determine relationships between a data volume of the first audio packet and a first upper threshold and a first lower threshold; configuring a clock generator to generate a clock signal; configuring a processor to control the clock generator to adjust a frequency of the clock signal; configuring a second interface to output the first audio packet from the buffer and the clock signal from the clock generator to a codec apparatus, such that the codec apparatus reads and processes the first audio packet according to the clock signal; in response to the buffer determining that the data volume of the first audio packet is less than the first lower threshold, configuring the buffer to output an underflow interrupt signal to the processor, and configuring the processor to control the clock generator according to the underflow interrupt signal, so as to reduce the frequency of the clock signal; and in response to the buffer determining that the data volume of the first audio packet is greater than the first upper threshold, configuring the buffer to output an overflow interrupt signal to the processor, configuring and the processor to control the clock generator according to the overflow interrupt signal, so as to increase the frequency of the clock signal.

Therefore, in the audio processing apparatus and the audio processing method for dynamically adjusting the audio clock based on the data volume of output audio data provided by the present disclosure, the data volume of the audio data output by the host is monitored by the buffer, and the clock signal is dynamically adjusted accordingly, which can effectively avoid an occurrence of audio data overflow or underflow, while ensuring an integrity of the audio data.

Furthermore, in the audio processing apparatus and the audio processing method for dynamically adjusting the audio clock based on the data volume of output audio data provided by the present disclosure, an adjustment range should be appropriately increased in response to the data volume being small or large, so to improve an efficiency, and an upper limit is also set to avoid an abnormal operation of the apparatus caused by an excessive fluctuation of the frequency of the clock signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
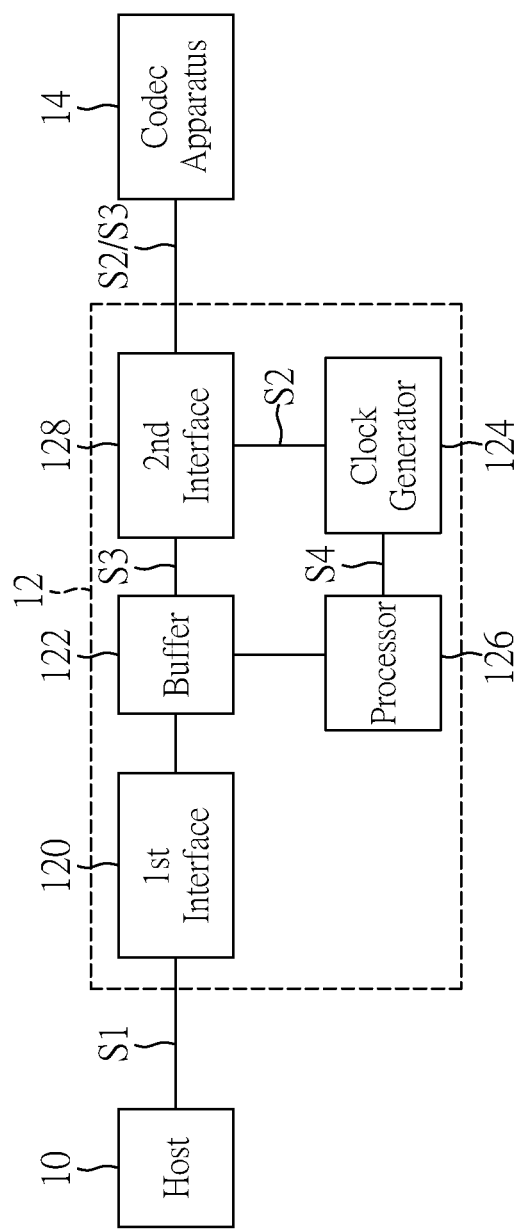
FIG. 1 is a functional block diagram of an audio processing apparatus according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

FIG. 1 is a functional block diagram of an audio processing apparatus according to one embodiment of the present disclosure. Referring to FIG. 1, one embodiment of the present disclosure provides an audio processing apparatus 12 for dynamically adjusting an audio clock, the audio processing apparatus is connected between a host 10 and a codec apparatus 14, and the audio processing apparatus 12 includes a first interface 120, a buffer 122, a clock generator 124, a processor 126 and a second interface 128.

The first interface 120 can be, for example, a universal serial bus (USB) interface, which is configured to receive audio data S1 from the host 10 and is coupled to the buffer 122. The second interface 128 can be, for example, an Inter-IC Sound (I2S) interface, which is configured to output the audio data S1 to the codec apparatus 14. In some embodiments, the host 10 can be provided in a computer, and the codec apparatus 14 can be a speaker connected to a USB port of the computer.

The clock generator 124 can be, for example, a phase lock loop (PLL) circuit, which is configured to generate a clock signal S2.

It should be noted that since the host 10 and the codec apparatus 14 use independent clock signals, the host 10 can have a built-in oscillator as a clock signal source, while the codec apparatus 14 uses a clock signal S2 provided by the clock generator 124 as its clock source. Therefore, a decoding processing speed of the codec device 14 is not synchronized with a generation speed of audio packets, which is likely to cause a data overflow interrupt or an empty interrupt, thereby causing sound-popping issues.

Therefore, the audio processing apparatus 12 of the present disclosure is further configured with a buffer 122, which can be, for example, a first-in-first-out (FIFO) buffer. The buffer 122 is coupled to the first interface 120, and is configured to store the audio data S1 in a first sampling stage to generate the first audio packet S3.

The second interface 128 is further coupled to the buffer 122, and is configured to output the first audio packet S3 from the buffer 122 and the clock signal S2 from the clock generator 124 to a codec apparatus 14, such that the codec apparatus reads the first audio packet S3 from the buffer 122 and processes the first audio packet S3 according to the clock signal S2.

As shown in FIG. 1, the processor 126 is configured to control the clock generator 124 through a control signal S4, so as to adjust a frequency of the clock signal S2. In some embodiments, a processor 126 represents one or more general-purpose processing devices, such as a microprocessor, a central processing unit, and the like. The processor 126 can be a complex instruction set computing (CISC) microprocessor, a reduced instruction set computing (RISC) microprocessor, a very long instruction word (VLIW) microprocessor, a processor that execute other instruction sets, or a processor that execute a combination of instruction sets. The processor 126 can also be one or more special purpose processing devices, such as an application specific integrated circuit (ASIC), a field programmable gate array (FPGA), a digital signal processor (DSP), a network processor, and the like.

Figure 2:
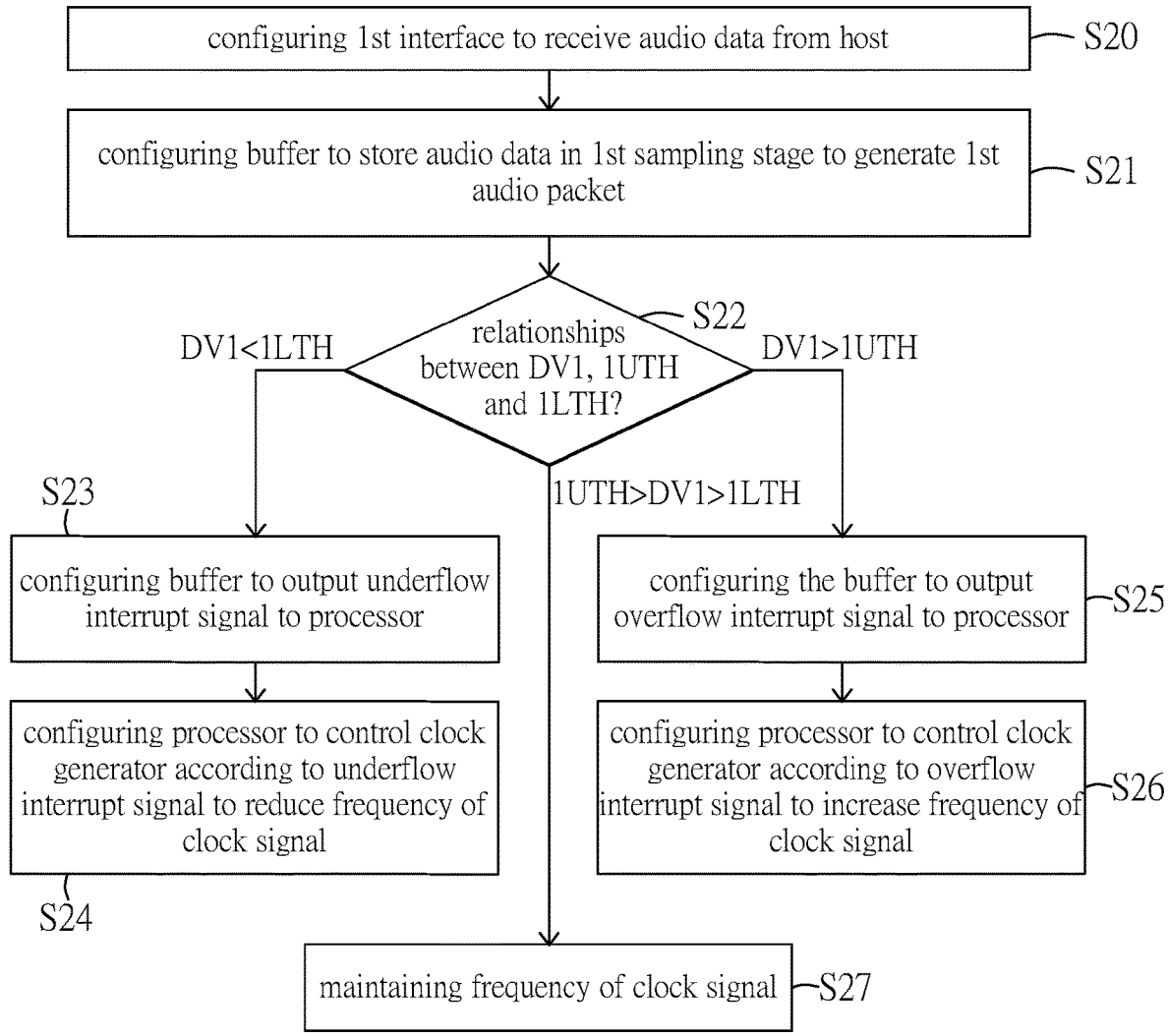
FIG. 2 is a flowchart of an audio processing method according to one embodiment of the present disclosure.

It should be noted that the present disclosure provides a processing mechanism capable of dynamically adjusting the audio clock according to data volume of the audio data, and is particularly implemented by the buffer 122, the processor 126 and the clock generator 124 mentioned above. Reference is next made to FIG. 2, which is a flowchart of an audio processing method according to one embodiment of the present disclosure.

As shown in FIG. 2, one embodiment of the present disclosure provides an audio processing method for dynamically adjusting an audio clock, which is applicable to the host 10, the audio processing device 12, and the codec apparatus 14 in FIG. 1, but the embodiment is only an example, and the present disclosure does not limit an implementation of the audio processing method. The audio processing method includes at least the following steps:

Step S20: configuring the first interface to receive the audio data from the host.

Step S21: configuring the buffer to store the audio data in the first sampling stage to generate the first audio packet.

Step S22: configuring the buffer to determine relationships between first data volume DV1 of the first audio packet and first upper and lower thresholds (1UTH and 1LTH).

It should be noted that 1UTH and 1LTH can be set according to requirements. For example, a packet size can be calculated by the following equation (1):

$$\text{Packet size} = \text{Resolution (in bits)} * (\text{Sampling rate}/1000) * \text{Number of channels} \quad \text{Equation (1);}$$

The following equations (2) and (3) can be used, and 1UTH and 1LTH can be set according to requirements:

$$1UTH = \text{Packet size} * TH1 \quad \text{Equation (2);}$$

$$1LTH = \text{Packet size} * TH2 \quad \text{Equation (3);}$$

where TH1 and TH2 can be threshold values set by the user according to the requirements.

In response to the buffer determining that the data volume of the first audio packet is less than the first lower threshold in step S22, the audio processing method proceeds to step S23 and step S24.

Step S23: configuring the buffer to output an underflow interrupt signal to the processor.

Step S24: configuring the processor to control the clock generator according to the underflow interrupt signal to reduce the frequency of the clock signal.

In response to the buffer determining that the data volume of the first audio packet is greater than the first upper threshold in step S22, the audio processing method proceeds to step S25 and step S26.

Step S25: configuring the buffer to output an overflow interrupt signal to the processor.

Step S26: configuring the processor to control the clock generator according to the overflow interrupt signal to increase the frequency of the clock signal.

In response to the buffer determining that the data volume of the first audio packet is between the first upper threshold and the first lower threshold in step S22, meaning that overflow or underflow does not occur, the audio processing method proceeds to step S27: maintaining the frequency of the clock signal.

Therefore, in the above process, the data volume of the audio data output by the host is monitored by the buffer, and the clock signal can be dynamically adjusted in accordance with the data volume, which can effectively avoid an occurrence of audio data overflow or underflow, while ensuring an integrity of the audio data.

However, in the above process, it is necessary to further consider a hysteresis of the adjusted clock signal, so as to avoid over-adjusting the frequency of the clock signal, causing the data volume of the first audio packet to be unable to always be correctly positioned between the first upper threshold and the first lower threshold.

Figure 3:
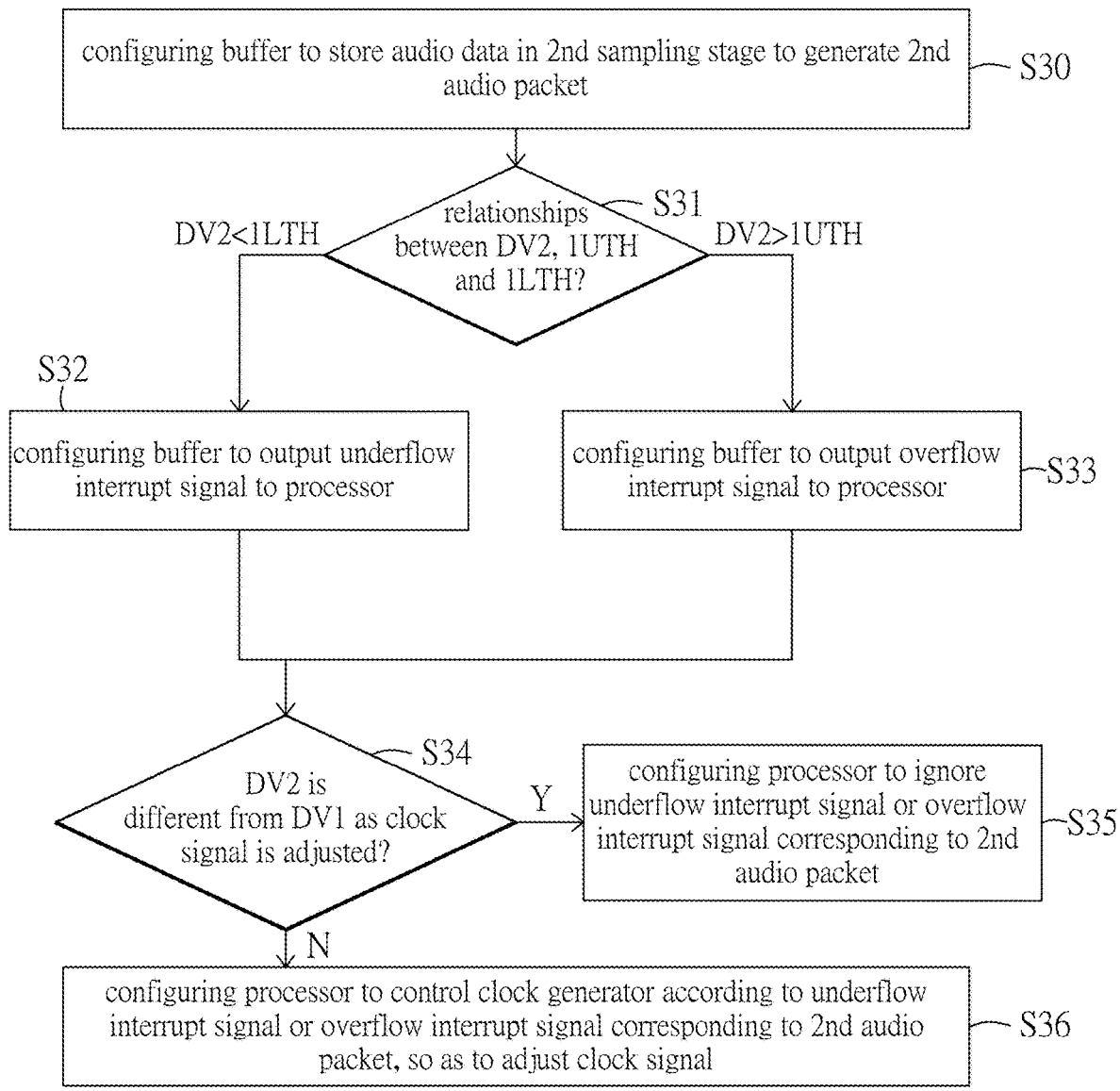
FIG. 3 is another flowchart of an audio processing method according to one embodiment of the present disclosure.

Reference is made to FIG. 3, which is another flowchart of an audio processing method according to one embodiment of the present disclosure. In continuation of steps S24 and S26 in FIG. 2, the audio processing method further includes the following steps:

Step S30: configuring the buffer to store the audio data in a second sampling stage to generate a second audio packet.

The difference from the process shown in FIG. 2 is that, in the audio processing method of FIG. 3, before the processor controls the clock generator to adjust the frequency of the clock signal according to the underflow interrupt signal or the overflow interrupt signal, the audio processing method first proceeds to step S31: determining relationships between the data volume (DV2) of the second audio packet and the first upper and lower thresholds (1UTH and 1LTH).

Similar to step S22, when the buffer determines that the data volume of the second audio packet is less than the first lower threshold, the audio processing method proceeds to step S32: configuring the buffer to output the underflow interrupt signal to the processor. When the buffer determines that the data volume of the second audio packet is greater than the first upper threshold, the audio processing method proceeds to step S33: configuring the buffer to output the overflow interrupt signal to the processor. It should be noted that steps S35 and S36 are still mechanisms for having the buffer continue to detect the data volume of the audio packet.

After step S32 or S33 is performed, the audio processing method proceeds to step S34: configuring the processor to determine whether data volume (DV2) of the second audio packet is different from the data volume (DV1) of the first audio packet as the clock signal is adjusted.

In response to the processor to determining the data volume (DV2) of the second audio packet is different from the data volume (DV1) of the first audio packet as the clock signal is adjusted, the audio processing method proceeds to step S35: configuring the processor to ignore the underflow interrupt signal or the overflow interrupt signal corresponding to the second audio packet. Therefore, this protection mechanism can be used to avoid over-adjusting the frequency of the clock signal that results in the data volume of the first audio packet being unable to always be correctly located between the first upper threshold and the first lower threshold.

In response to the processor to determining the data volume (DV2) of the second audio packet is not different from the data volume (DV1) of the first audio packet as the clock signal is adjusted, the audio processing method proceeds to step S36: configuring the processor to control the clock generator according to the underflow interrupt signal or the overflow interrupt signal corresponding to the second audio packet, so as to adjust the clock signal.

Figure 4:
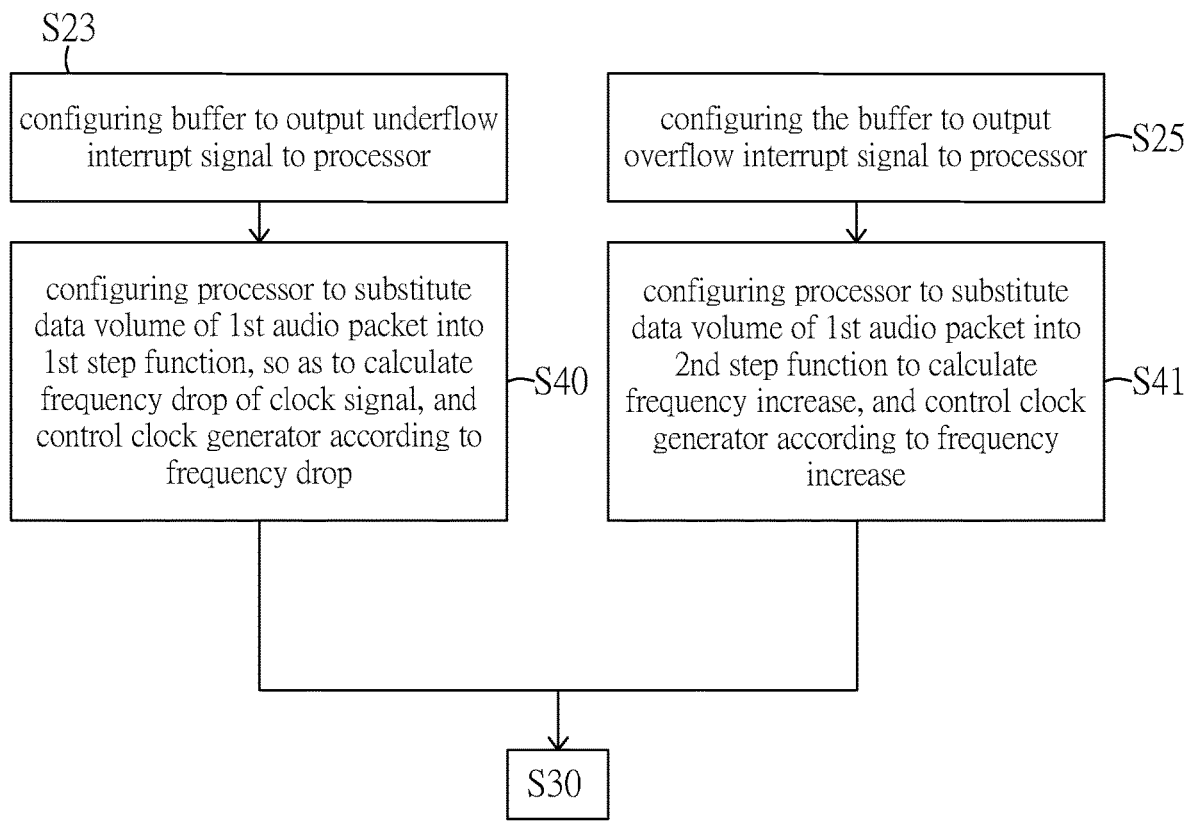
FIG. 4 is yet another flowchart of an audio processing method according to one embodiment of the present disclosure.
Figure 5:
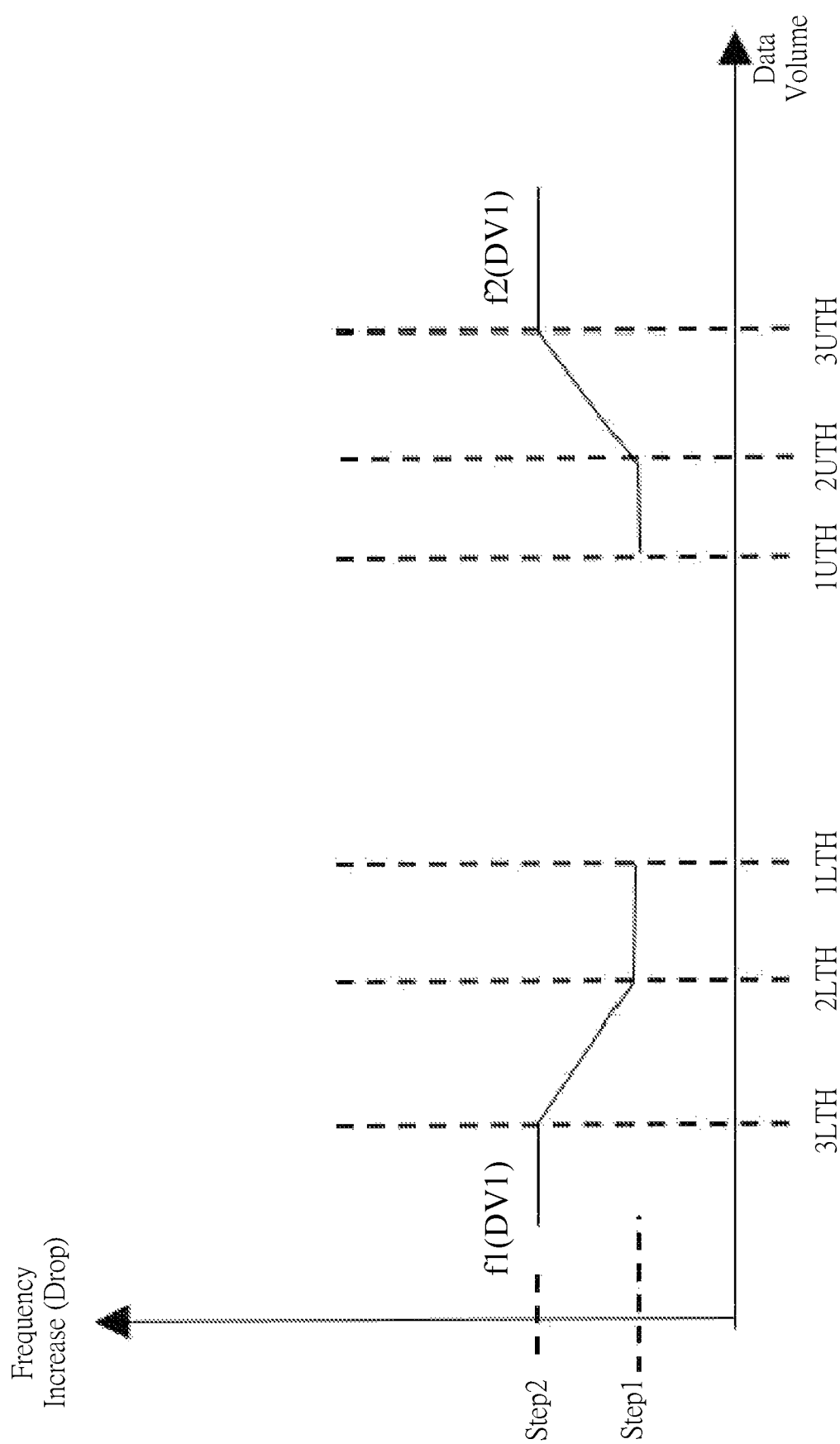
FIG. 5 is a graph showing frequency increase/decrease of a first step function and a second step function versus data volume of a first audio packet according to one embodiment of the present disclosure.

Further reference can be made to FIGS. 4 and 5. FIG. 4 is yet another flowchart of an audio processing method according to one embodiment of the present disclosure, and FIG. 5 is a graph showing frequency increase/decrease of a first step function and a second step function versus data volume of a first audio packet according to one embodiment of the present disclosure.

As shown in FIG. 4, after step S23, in response to the processor receiving the underflow interrupt signal, the audio processing method proceeds to step S40: configuring the processor to substitute the data volume of the first audio packet into a first step function, so as to calculate a frequency drop of the clock signal, and control the clock generator according to the frequency drop.

Taking FIG. 5 as an example, when data volume DV1 is between the first lower threshold 1LTH and the second lower threshold 2LTH, the frequency drop calculated by the first step function f1(DV1) is a first amplitude Step 1; when the data volume DV1 is between the second lower threshold 2LTH and the third lower threshold 3LTH, the frequency drop calculated by the first step function f1(DV1) increases linearly, and increases from the first amplitude Step1 to a second amplitude Step2; when the data volume DV1 is less than the third lower threshold 3LTH, the frequency drop calculated by the first step function f1(DV1) ceases to increase. In other words, the present disclosure further restricts the frequency drop calculated by the first step function f(DV1) to be not greater than an upper limit (i.e., the second amplitude Step2) of the frequency drop. Therefore, when the data volume is small, an adjustment range (the frequency drop) can be appropriately increased to improve efficiency, and the upper limit is also set to avoid an abnormal operation of the audio processing apparatus caused by an excessive fluctuation of the frequency of the clock signal.

On the other hand, after step S25 in performed, in response to the processor receiving the overflow interrupt signal, the audio processing method proceeds to step S41: configuring the processor to substitute the data volume of the first audio packet into the second step function to calculate the frequency increase, and control the clock generator according to the frequency increase.

Similarly, taking FIG. 5 as an example, when the data volume DV1 is between the first upper threshold 1UTH and a second upper threshold (2UTH), the frequency increase calculated by the second step function f2(DV1) is the first amplitude Step1; when the data volume DV1 is between the second upper threshold 2UTH and a third upper threshold (3UTH), the frequency increase calculated by the second step function f2(DV1) increases linearly, and the first amplitude Step1 rises to the second amplitude Step2; when the data volume DV1 is greater than the third upper threshold 3UTH, the frequency increase calculated by the second step function f2(DV1) does not rise any more. In other words, the present disclosure further restricts the frequency increase calculated by the second step function f2(DV1) to be not greater than the upper limit (the second amplitude Step2) of the frequency increase. Therefore, when the data volume is large, an adjustment range (the frequency increase) can be appropriately increased to improve efficiency, and the upper limit is also set to avoid an abnormal operation of the audio processing apparatus caused by an excessive fluctuation of the frequency of the clock signal.

Therefore, after steps S40 and S41 are performed, the audio processing method can return to step S30 and execute the subsequent protection mechanism.

BENEFICIAL EFFECTS OF EMBODIMENT

In conclusion, in the audio processing apparatus and the audio processing method for dynamically adjusting the audio clock provided by the present disclosure, the data volume of the audio data output by the host is monitored by the buffer, and the clock signal is dynamically adjusted accordingly, which can effectively avoid an occurrence of audio data overflow or underflow, while ensuring an integrity of the audio data.

Furthermore, in the audio processing apparatus and the audio processing method for dynamically adjusting the audio clock provided by the present disclosure, an adjustment range should be appropriately increased in response to the data volume being small or large, so to improve an efficiency, and an upper limit is also set to avoid an abnormal operation of the apparatus caused by an excessive fluctuation of the frequency of the clock signal.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An audio processing apparatus for dynamically adjusting an audio clock, the audio processing apparatus comprising:
   a first interface configured to receive audio data from a host;
   a buffer coupled to the first interface, wherein the buffer is configured to store the audio data in a first sampling stage to generate a first audio packet, and determine relationships between a data volume of the first audio packet and a first upper threshold and a first lower threshold;
   a clock generator configured to generate a clock signal;
   a processor configured to control the clock generator to adjust a frequency of the clock signal;
   a second interface coupled to the buffer, wherein the second interface is configured to output the first audio packet from the buffer and the clock signal from the clock generator to a codec apparatus, such that the codec apparatus reads and processes the first audio packet according to the clock signal,
   wherein, in response to the buffer determining that the data volume of the first audio packet is less than the first lower threshold, the buffer is configured to output an underflow interrupt signal to the processor, and the processor is configured to control the clock generator according to the underflow interrupt signal, so as to reduce the frequency of the clock signal,
   wherein, in response to the buffer determining that the data volume of the first audio packet is greater than the first upper threshold, the buffer is configured to output an overflow interrupt signal to the processor, and the processor is configured to control the clock generator according to the overflow interrupt signal, so as to increase the frequency of the clock signal.

2. The audio processing apparatus according to claim 1, wherein the buffer is further configured to store the audio data at a second sampling stage to generate a second audio packet, and the buffer is configured to determine relationships between a data volume of the second audio packet and the first upper threshold and the first lower threshold,
   wherein, in response to the buffer determining that the data volume of the second audio packet is less than the first lower threshold, the buffer is configured to output the underflow interrupt signal to the processor,
   wherein, in response to the buffer determining that the data volume of the second audio packet is greater than the first upper threshold, the buffer is configured to output the overflow interrupt signal to the processor.

3. The audio processing apparatus according to claim 2, wherein the processor is further configured to determine whether the data volume of the second audio packet is different from the data volume of the first audio packet as the clock signal is adjusted, and in the affirmative, the processor is configured to ignore the underflow interrupt signal or the overflow interrupt signal corresponding to the second audio packet signal.

4. The audio processing apparatus according to claim 1, wherein, in response to the processor receiving the underflow interrupt signal, the processor is further configured to substitute the data volume of the first audio packet into a first step function, so as to calculate a frequency drop of the clock signal and control the clock generator according to the frequency drop, wherein, in response to the processor receiving the overflow interrupt signal, the processor is further configured to substitute the data volume of the first audio packet into a second step function, so as to calculate a frequency increase of the clock signal and control the clock generator according to the frequency increase.

5. The audio processing apparatus according to claim 4, wherein the frequency drop is not greater than a frequency drop upper limit, and the frequency increase is not greater than a frequency increase upper limit.

6. The audio processing apparatus according to claim 1, wherein the buffer is a first-in-first-out (FIFO) buffer.

7. The audio processing apparatus of claim 1, wherein the first interface is a universal serial bus (USB) interface.

8. The audio processing apparatus according to claim 1, wherein the second interface is an Inter-IC Sound (I2S) interface.

9. The audio processing apparatus according to claim 1, wherein the clock generator is a phase lock loop (PLL) circuit.

10. An audio processing method for dynamically adjusting an audio clock, the audio processing method comprising:
    configuring a first interface to receive audio data from a host;
    configuring a buffer to store the audio data in a first sampling stage to generate a first audio packet, and determine relationships between a data volume of the first audio packet and a first upper threshold and a first lower threshold;
    configuring a clock generator to generate a clock signal;
    configuring a processor to control the clock generator to adjust a frequency of the clock signal;
    configuring a second interface to output the first audio packet from the buffer and the clock signal from the clock generator to a codec apparatus, such that the codec apparatus reads and processes the first audio packet according to the clock signal;
    in response to the buffer determining that the data volume of the first audio packet is less than the first lower threshold, configuring the buffer to output an underflow interrupt signal to the processor, and configuring the processor to control the clock generator according to the underflow interrupt signal, so as to reduce the frequency of the clock signal; and
    in response to the buffer determining that the data volume of the first audio packet is greater than the first upper threshold, configuring the buffer to output an overflow interrupt signal to the processor, configuring and the processor to control the clock generator according to the overflow interrupt signal, so as to increase the frequency of the clock signal.

11. The audio processing method according to claim 10, further comprising:
    configuring the buffer to store the audio data at a second sampling stage to generate a second audio packet, and determine relationships between a data volume of the second audio packet and the first upper threshold and the first lower threshold;
    in response to the buffer determining that the data volume of the second audio packet is less than the first lower threshold, configuring the buffer to output the underflow interrupt signal to the processor; and
    in response to the buffer determining that the data volume of the second audio packet is greater than the first upper threshold, configuring the buffer to output the overflow interrupt signal to the processor.

12. The audio processing method according to claim 11, further comprising:
    configuring the processor to determine whether the data volume of the second audio packet is different from the data volume of the first audio packet as the clock signal is adjusted, and in the affirmative, configuring the processor to ignore the underflow interrupt signal or the overflow interrupt signal corresponding to the second audio packet signal.

13. The audio processing method according to claim 10, further comprising:
    in response to the processor receiving the overflow interrupt signal, configuring the processor to substitute the data volume of the first audio packet into a second step function, so as to calculate a frequency increase of the clock signal and control the clock generator according to the frequency increase; and
    in response to the processor receiving the overflow interrupt signal, configuring the processor to substitute the data volume of the first audio packet into a second step function, so as to calculate a frequency increase of the clock signal and control the clock generator according to the frequency increase.

14. The audio processing method according to claim 13, wherein the frequency drop is not greater than a frequency drop upper limit, and the frequency increase is not greater than a frequency increase upper limit.

15. The audio processing method according to claim 10, wherein the buffer is a first-in-first-out (FIFO) buffer.

16. The audio processing method according to claim 10, wherein the first interface is a universal serial bus (USB) interface.

17. The audio processing method according to claim 10, wherein the second interface is an Inter-IC Sound (I2S) interface.

18. The audio processing method according to claim 10, wherein the clock generator is a phase lock loop (PLL) circuit.

* * * * *